United States Patent
Buenting et al.

(10) Patent No.: US 11,111,576 B2
(45) Date of Patent: Sep. 7, 2021

(54) METHOD FOR PRODUCING NANOSTRUCTURED LAYERS

(71) Applicant: Forschungszentrum Juelich GmbH, Juelich (DE)

(72) Inventors: Aiko Buenting, Aachen (DE); Sven Uhlenbruck, Juelich (DE)

(73) Assignee: Forschungszentrum Juelich GmbH, Juelich (DE)

( * ) Notice: Subject to any disclaimer, the term of this patent is extended or adjusted under 35 U.S.C. 154(b) by 130 days.

(21) Appl. No.: 15/578,809

(22) PCT Filed: Apr. 27, 2016

(86) PCT No.: PCT/DE2016/000176
§ 371 (c)(1),
(2) Date: Dec. 1, 2017

(87) PCT Pub. No.: WO2016/198033
PCT Pub. Date: Dec. 15, 2016

(65) Prior Publication Data
US 2018/0163293 A1 Jun. 14, 2018

(30) Foreign Application Priority Data
Jun. 10, 2015 (DE) ............ 10 2015 007 291.6

(51) Int. Cl.
*H01M 4/82* (2006.01)
*H01M 6/00* (2006.01)
(Continued)

(52) U.S. Cl.
CPC .......... *C23C 14/3414* (2013.01); *B82Y 30/00* (2013.01); *B82Y 40/00* (2013.01);
(Continued)

(58) Field of Classification Search
None
See application file for complete search history.

(56) References Cited

U.S. PATENT DOCUMENTS

| 6,555,270 B2 * | 4/2003 | Bates ............ C01G 51/42 429/218.1 |
| 2005/0016832 A1 * | 1/2005 | Jankowski ........ C23C 14/165 204/192.1 |

(Continued)

FOREIGN PATENT DOCUMENTS

| CN | 103000879 B | 3/2013 |
| CN | 103579623 A | 2/2014 |

(Continued)

OTHER PUBLICATIONS

Liao C L et al: "Preparation of RF-sputtered lithium cobalt oxide nanorods by using porous anodic alumina (PAA) template", Journal of Alloys and Compounds, Elsevier Sequoia, Lausanne, CH, vol. 414, No. 1-2, Apr. 13, 2006 (Apr. 13, 2006), pp. 302-309, XP027999329.

(Continued)

*Primary Examiner* — Cynthia H Kelly
*Assistant Examiner* — Julian Anthony
(74) *Attorney, Agent, or Firm* — Leydig, Voit & Mayer, Ltd.

(57) ABSTRACT

According to a method for producing a nanostructured electrode for an electrochemical cell, in which active material is applied to an electrically conductive substrate, the active material is deposited on the electrically conductive substrate by magnetron sputtering in one process step, a ceramic target comprising an electrode material having an additional carbon proportion between 0.1 and 25% by weight is used, the substrate being kept at temperatures between 400° C. and 1200° C. during the deposition, in such a way that a fibrous porous network is formed.

14 Claims, 2 Drawing Sheets

(51) Int. Cl.

| | |
|---|---|
| *H01M 4/13* | (2010.01) |
| *H01M 4/58* | (2010.01) |
| *C23C 14/34* | (2006.01) |
| *C23C 14/35* | (2006.01) |
| *H01M 4/04* | (2006.01) |
| *H01M 4/1391* | (2010.01) |
| *B82Y 30/00* | (2011.01) |
| *B82Y 40/00* | (2011.01) |
| *H01M 4/131* | (2010.01) |
| *C23C 14/06* | (2006.01) |
| *H01M 4/136* | (2010.01) |
| *H01M 4/1397* | (2010.01) |
| *H01M 4/525* | (2010.01) |

(52) U.S. Cl.
CPC .......... *C23C 14/06* (2013.01); *C23C 14/0605* (2013.01); *C23C 14/35* (2013.01); *H01M 4/0404* (2013.01); *H01M 4/0426* (2013.01); *H01M 4/131* (2013.01); *H01M 4/136* (2013.01); *H01M 4/1391* (2013.01); *H01M 4/1397* (2013.01); *H01M 4/525* (2013.01); *H01M 4/5825* (2013.01)

(56) References Cited

U.S. PATENT DOCUMENTS

| | | | |
|---|---|---|---|
| 2008/0213664 A1* | 9/2008 | Krasnov | H01M 4/0426 429/220 |
| 2008/0217162 A1* | 9/2008 | Delrue | C23C 14/08 204/192.15 |
| 2009/0166187 A1 | 7/2009 | Nagase et al. | |
| 2010/0129693 A1 | 5/2010 | Nguyen et al. | |
| 2010/0285358 A1* | 11/2010 | Cui | H01M 4/1395 429/218.1 |
| 2011/0143019 A1* | 6/2011 | Mosso | C23C 16/545 427/58 |
| 2012/0208081 A1 | 8/2012 | Bartkowiak et al. | |
| 2012/0260478 A1 | 10/2012 | Kuriki | |
| 2013/0164459 A1* | 6/2013 | Nieh | H01J 37/3426 427/580 |
| 2015/0084157 A1* | 3/2015 | Tegen | H01M 6/40 257/528 |
| 2015/0248997 A1* | 9/2015 | Lo | C23C 14/08 428/220 |

FOREIGN PATENT DOCUMENTS

| | | |
|---|---|---|
| DE | 102009034799 A1 | 1/2011 |
| JP | 2009295514 A | 12/2009 |
| JP | 2012230889 A | 11/2012 |
| JP | 2014089895 A | 5/2014 |

OTHER PUBLICATIONS

Hwang B J et al: "Template-free reverse micelle process for the synthesis of a rod-like LiFeP04/C composite cathode material for lithium batteries", Journal of Power Sources, Elsevier SA, CH, vol. 194, No. 1, Oct. 20, 2009 (Oct. 20, 2009), pp. 515-519, XP026446374.

Gints Kucinskis et al: "Kinetic Behaviour of LiFeP04/C Thin Film Cathode Material for Lithium-Ion Batteries", Scientific Journal RIGA Techniucal University. Environmental and Climate Technologies, vol. 4, No. -1, Jan. 1, 2010 (Jan. 1, 2010), XP055283888.

Aiko Bünting et al: "Three-Dimensional, Fibrous Lithium Iron Phosphate Structures Deposited by Magnetron Sputtering", ACS Applied Materials and Interfaces, vol. 7, No. 40, Sep. 18, 2015 (Sep. 18, 2015), pp. 22594-22600, XP055283674.

Aiko Bünting: "Herstellung von Elektrodenstrukturen für Lithium-Ionen-Dünnschichtbatterien", chriften des Forschungszentrums Jülich Reihe Energie & Welt, vol. 151, Aug. 26, 2015 (Aug. 26, 2015), XP055283950.

A. F. Jankowski, et al., „Sputter deposition of a spongelike morphology in metal coatings, J. Vac. Sci. Technol. A 21(2), Mar./Apr. 2003, pp. 422-425.

Darina Manova, et al., "Thin Film Deposition Using Energetic Ions", Materials 2010, vol. 3, Jul. 29, 2010, pp. 4109-4141.

Brian L. Ellis, et al., "Three-Dimensional Self-Supported Metal Oxides for Advanced Energy Storage", Adv. Mater., vol. 26, Dec. 2014, pp. 3368-3397.

John A. Thornton, "Influence of substrate temperature and deposition rate on structure of thick sputtered Cu coatings", J. Vac. Sci. Technol., vol. 12, No. 4, Jul./Aug. 1975, pp. 830-835.

P.J. Kelly, et al., "Magnetron sputtering: a review of recent developments and applications", Vacuum, vol. 56, Dec. 2000, pp. 159-172.

Rossana Gazia, et al., "An easy method for the room-temperature growth of spongelike nanostructured Zn films as initial step for the fabrication of nanostructured ZnO", Thin Solid Films, vol. 524, Oct. 13, 2012.

J.C. Sit, et al., "Thin film microstructure control using glancing angle deposition by sputtering", J. Maters. Res., vol. 14, No. 4, Apr. 1999, pp. 1197-1199.

International Search Report of PCT/DE2016/000176, dated Jul. 7, 2016.

* cited by examiner

METHOD FOR PRODUCING NANOSTRUCTURED LAYERS

CROSS-REFERENCE TO PRIOR APPLICATIONS

This application is a U.S. National Phase application under 35 U.S.C. § 371 of International Application No. PCT/DE2016/000176, filed on Apr. 27, 2016, and claims benefit to German Patent Application No. DE 10 2015 007 291.9, filed on Jun. 10, 2015. The International Application was published in German on Dec. 15, 2016 as WO 2016/198033 A1 under PCT Article 21(2).

FIELD

The invention relates to a method for producing nanostructured layers, in particular nanostructured electrodes that can be used in batteries and other electrochemical cells.

BACKGROUND

Nanostructured materials are generally built up of nanoparticles. These nanoparticles typically comprise a few hundred atoms or molecules, which form discrete units. They have a size in the nanometer range, or less than 100 nm, in at least one dimension. Nanostructured materials frequently have properties differing from the properties of the same compound at significantly larger dimensions, for example in the micrometer range. In particular, they have a high surface-to-volume ratio. Further distinguishing properties of nanostructured materials are high mechanical stability and tolerance to changes in volume.

For the aforementioned reason, among others, nanostructured materials are particularly suitable for use as electrodes in batteries. As a result of the large surface-to-volume ratio, the contact area between the electrolyte and the electrode is advantageously increased, and the distance for ion transport into the material is reduced. As a result, nanostructured electrode materials can generally achieve a higher performance and reduce polarization losses. Further, nanostructured electrodes have a high stability against the accumulation of ions and the associated disadvantageous change in volume, making it possible to increase the service life of the batteries.

The production method most common thus far for nanostructured layers and coatings is based on wet chemical methods. These include in particular hydrothermal/solvothermal synthesis, sol gel processes, micro-emulsion syntheses and electrochemical deposition.

In these methods, the active materials, conductive additives and binder-containing coating compositions and dispersions that are produced as nanomaterials are generally coated onto conductive films as current collectors. Both water and organic solvents may be used in the production of dispersions of this type.

Disadvantageously, however, the viscosity of the coating suspension can change over the course of a few hours, for example as a result of a suspension composition that is not perfectly suitable. For example, a chemical reaction may occur between components of the suspension. In some cases, the organic solvents known thus far as being suitable for producing electrodes additionally have the drawback that they are classified as toxic.

Using hydrothermal/solvothermal synthesis, sol gel processes or electrochemical deposition, it is also possible to produce "self-supporting" structures directly, in other words binder-free structures.

For the purposes of this disclosure, wet chemical methods are understood more broadly as also including methods in which powder is initially produced by the aforementioned methods. These are subsequently processed into layers using powder technology methods, such as casting or pressure methods, in particular including with the assistance of auxiliary substances, for example liquids, in particular solvents, binders, dispersants, surfactants or antifoaming agents. The mixture of powders with auxiliary materials of this type for further processing is also known as slurry.

Nanostructured materials can also be produced by the aforementioned methods. Disadvantageously, these nanostructured materials are freestanding, in other words not already arranged on a conductive substrate. Therefore, in a second method step, an electrode slurry, consisting of the previously produced nanostructured active materials, conductive additives and binders, generally has to be produced and applied to the conductive film or the conductive substrate.

Disadvantageously, this can lead to agglomeration of the nanoparticles, often causing them to lose their distinctive properties. Further, the electrode slurry contains binders and generally also additional conductive carbon, generally causing a disadvantageous reduction in the specific energy of the battery in which the electrode thus produced is used.

The production of nanostructured materials as coatings using the wet chemical approach in the broader sense thus generally takes place over a plurality of process steps. In this context, as well as in chemical vapor deposition, toxic raw materials, dispersants, binders or solvents are sometimes used. Further, masks or templates and catalysts are sometimes required in these methods.

A coating method of this type for producing nanostructured electrodes for electrical energy stores using a specific solvent and/or dispersing agent is known for example from DE 10 2009 034 799 A1.

Very recent developments show that nanostructured electrodes produced by self-supporting techniques, in other words without additives and binders, have a number of advantages over wet-chemically produced electrodes, in particular in the surface constitution thereof and the improved electronic transport properties thereof. B. L. Ellis, P. Knauth, T. Djenizian, Three-dimensional self-supported metal oxides for advanced energy storage, Advanced Materials 2014, 26(21), 3368-3397 gives an overview of the role of 3D self-supporting nanostructured oxides as electrodes and electrolyte material for energy storage. A self-supporting electrode is understood to mean that electroactive material grows directly on a conductive substrate, and additives and binders, such as are often found in the electrode slurry in larger electrodes, can thus be avoided.

Magnetron sputtering is further known as a production method for depositing various coatings, in which a relatively thick coating can generally be applied to a substrate. In sputtering, also known as cathode sputtering, atoms, ions or clusters thereof from a solid body (known as the target) are released by bombarding with high-energy ions (predominantly noble gas ions) and brought into the vapor phase, and are subsequently depositing on the surface of a substrate that is to be coated. A production method of this type is often used for dense, hard, wear-resistant, low-friction, corrosion-resistant or decorative coatings or for coatings having special optical or electrical properties, as is known from "Magnetron sputtering: a review of recent developments and applications", P. J. Kelly, R. D. Arnell, Vacuum, volume 56, issue 3, March 2000, pages 159-172.

The structure of a layer deposited by magnetron sputtering is dependent in particular on the method parameters of temperature and pressure. Using the example of metals, it has been possible to show that in sputtering a thicker layer generally forms with increasing temperature.

To describe this behavior, a "structure zone model" has been developed, which is shown in FIG. 1 and is derived from "Influence of substrate temperature and deposition rate on structure of thick sputtered Cu coatings", by Thornton, J. A., Journal of Vacuum Science & Technology, 1975, 12(4): pages 830-835.

From "Thin film microstructure control using glancing angle deposition by sputtering", J. C. Sit, D. Vick, K. Robbie, M. J. Brett, Journal of Materials Research 14 (04), 1197-1199, it is further known that coatings that are nanostructured in a defined manner can also be produced by a sputtering method. In this case, the raw material of the material source is brought into the vapor phase by a sputtering process, thermal evaporation or laser irradiation. However, to produce the coatings that are nanostructured in a defined manner, a particular experimental setup is required in which the substrate is at an angle α (tilted) with respect to the raw material source as regards the angle of incidence of the sputtered substrate, a typically even being more than 80°. At the same time, the substrate itself can perform a rotation about an axis perpendicular to the substrate surface by means of a stepper motor during the deposition. The material is thus deposited in columns in an oblique/grazing incidence.

The method is also known as "glancing angle deposition" (GLAD). In this case, the angle of incidence a influences the gap between the column-shaped depositions and thus the porosity of the deposited film. To achieve a porous film that is microstructured in a controlled manner, it is therefore necessary to be able to set a very narrow angular distribution for the sputtered material. The structures used thus far have for example zigzag, spirally (helically) twisted or column-shaped microstructures.

A drawback of the production of nanostructured materials thus far by physical vapor deposition at an oblique angle of incidence is a very complex experimental setup, which generally results in losses in deposition rate. In addition, the coating is limited to regions having a small area.

SUMMARY

In an embodiment, the present invention provides a method for producing a nanostructured electrode for an electrochemical cell, the method comprising: depositing active material on the electrically conductive substrate by magnetron sputtering in one process step using a ceramic target comprising an electrode material having an additional carbon proportion between 0.1 and 25% by weight, the substrate being kept at temperatures between 400° C. and 1200° C. during the deposition, so as to form a fibrous porous network.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
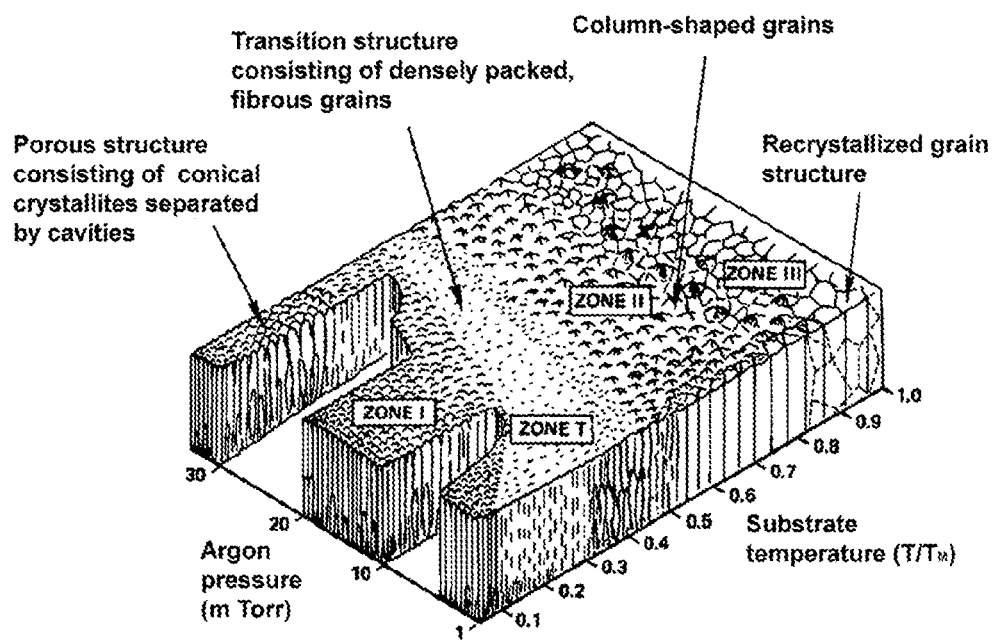
FIG. 1: shows a "structure zone model."

In an embodiment, the present invention provides a method for producing nanostructured electrodes for electrical energy stores, in particular for lithium ion cells, that overcomes the drawbacks known in the art. In particular, an embodiment of the invention produces and provides nanostructured electrodes of this type preferably in a single process step.

In an embodiment, nanostructured electrodes are produced by physical vapor deposition using a magnetron sputtering installation by means of a ceramic target. The nanostructured electrodes and the characterizing features thereof may be derived from the coordinated claims.

In a possible application thereof, the production method according to certain embodiments of the invention for nanostructured materials provide that a substrate is coated with at least one coating material using the method of magnetron sputtering.

Unlike in the known sputtering methods, in particular the "glancing angle deposition" (GLAD) method, without being bound to any particular theory, it has been found that by using magnetron sputtering under particular conditions it is possible to deposit a nanostructured layer that does not have the conventional columnar structures, in other words column-shaped structures having a preferential direction perpendicular to the surface, it instead being possible to produce a nanostructured, fibrous, finely branched network (net-like nanostructuring) without a particular preferential direction. As a result, agglomeration of the deposited material, which would otherwise occur frequently, can advantageously be prevented.

The nanostructuring according to certain embodiments of the invention of the active material generally has a fibrous nanoscale net structure.

The active material itself preferably has a porosity between 20 and 90%.

For producing the net-like nanostructuring in a manner according to certain embodiments of the invention, it is important to set the substrate temperature selectively, in addition to the conventional process parameters for the sputtering method such as process power, process gas, process pressure and gas flow. In this context, it is important in particular that the substrate temperature is set sufficiently high during the deposition, meaning greater than 400° C., preferably even higher than 500° C.

In a particular embodiment, the production method provides that an electrically conductive substrate is coated with at least one active material by the method of magnetron sputtering. This applied layer can subsequently take on for example the function of an electrode functional layer in an electrochemical cell.

A sputtering method means in particular cathode sputtering, in which, in a physical process, atoms, ions or clusters from a solid body (target) are released by bombarding with high-energy ions (predominantly noble gas ions) and pass into the vapor phase.

Sputtering deposition is understood to mean a coating or a coating method belonging to the group of physical vapor deposition (PVD) methods. Initially, material from a target is atomized by a sputtering method and brought into the vapor phase, which subsequently precipitates on a substrate and forms a solid layer. In the field of coating, sputtering deposition is frequently merely referred to as "sputtering".

Depending on the configuration, the target material is atomized into atoms, ions or larger clusters or even into all three forms in portions. The atomized material is moved through the sputtering chamber, guided either ballistically or in the case of charged particles by electrical fields, and is thus incident on the parts to be coated (substrate), where a layer comes to be formed on the surface of the substrate.

The ions required for sputtering are generally produced by impact ionization processes brought about by electrical fields. Using a sputtering method having a constant electrical field and a resulting direct current ("DC sputtering"), in general almost all metals, semimetals and also carbon can be deposited in a very pure form. If reactive gases such as oxygen, nitrogen or hydrocarbons are additionally supplied during the method, the corresponding oxides, nitrides or carbides can also be deposited.

Further, it is possible to deposit non-conductive ceramic materials. In this case, it is fundamentally necessary to operate the process using a high-frequency alternating voltage and as a result an alternating current ("RF sputtering") so as to avoid charging the target. Alternatively, a (bipolar) voltage pulse (in other words an electrical pulse for gas ionization, current conduction and sputtering deposition, optionally followed by a further voltage pulse for discharging the target surface) may be used ("pulsed sputtering").

Using the aforementioned sputtering methods, predominantly thin layers in the range of a few nanometers to a few micrometers, for example of 50 nm to 100 µm, may be deposited on a substrate. In the case of thin layers, with increasing layer thickness the internal stresses within the layers generally increase. This often leads to the applied layer detaching from the substrate (delamination), and is one of the reasons why it is not generally possible to produce arbitrarily thick layers by a sputtering method.

An active material is generally understood to mean a material that makes it possible to reversibly accumulate and decumulate electrically charged particles in electrochemical cells.

In the case of a lithium ion cell, the electrically charged particles are generally lithium ions. The accumulation and decumulation processes take place at the cathode and anode respectively during charging and discharging. For producing the anode and cathode, different active materials are generally used in each case.

Therefore, in the method according to certain embodiments of the invention, a target is used that is made of an active material (cathode or anode material) preferably selected from the group comprising

- graphite
- amorphous carbons (for example hard carbon, soft carbon),
- lithium storage metals, semimetals and alloys, including semiconductors (for example nanocrystalline or amorphous silicon and silicon carbon composites, Sn, Al, Sb),
- $Li_4Ti_5O_{12}$ or mixtures of these materials with further active materials or with Li ion conductors or electron conductors,
- lithium metal oxides of the $LiM_xO_2$ type, where M=Co, Ni, Mn, Al (for example $LiCoO_2$, $LiMnO_2$, $LiNiO_2$, $LiNi_{1-x}Co_xO_2$, $LiNi_{0.85}Co_{0.1}Al_{0.05}O_2$, $Li_{1+x}(Ni_y Co_{1-2y}Mn_y)_{1-x}O_2$, in particular where $0 \leq x \leq 0.17$ and $0 \leq y \leq 0.5$),
- $LiMn_2O_4$ spinel, optionally partially substituted with other ions,
- lithium metal phosphates of the $LiMPO_4$ type, where M=Fe, Mn, Co, V, optionally also with added carbon (for example $LiFePO_4$, $LiMnPO_4$, $LiCoPO_4$, $LiVPO_4$), optionally partially substituted with other ions, and
- conversion materials such as iron(III) fluoride ($FeF_3$), or $V_2O_5$.

In particular, those materials which undergo a major fluctuation in volume during the accumulation or decumulation of an electrochemical process are particularly suitable for the application method according to certain embodiments of the invention.

Mixtures of these aforementioned materials are also suitable as active materials. In particular ceramic targets that are mixed with carbon (soft/hard carbon) are suitable for producing nanostructured layers. In this context, soft carbon is understood to mean non-graphite carbons that are converted to graphite at high temperatures of up to 3200° C. Hard carbon is understood to mean non-graphite carbons that are not converted into graphite at the temperatures implemented in the art. Magnesium or niobium or the ions thereof, for example, are conceivable substitution elements for lithium metal phosphates.

In this context, all conventional electrode substrates that are mechanically and thermally stable up to temperatures of at least 400° C., preferably up to 500° C., are suitable as electrically conductive substrates. Among other things, the selected deposition temperature also plays a role here.

Unlike in the wet chemical methods known thus far, the active material for the electrodes need not first be provided as a powder having particles having dimensions in the micrometer, sub-micrometer or nanometer range ("micro-powder" or "nano-powder"), but rather, in the production method according to certain embodiments of the invention, deposition from a target directly onto the surface of the substrate, in the form of nanoparticles, is possible by a sputtering process. Other pre-treatments, such as applying masks, are also not necessary.

As a result, the desired porous, net-like nanostructured layer can advantageously be produced in a single operating step, and can subsequently take on the function of an electrode functional layer. Further post-treatments, such as removing masks, a crystallization step or drying, or burning off placeholders, are likewise not provided in the method according to the invention.

Unlike in the GLAD method known thus far, according to certain embodiments of the invention it is also not necessary for the substrate to be at an angle α (tilted) with respect to the raw material source (target) as regards the angle of incidence of the sputtered substrate. As a result, a complex production construction can advantageously be dispensed with.

In the method according to certain embodiments of the invention, the process parameters during the magnetron sputtering should be kept within a particular range. These include for example:

Process pressure range: $1 \cdot 10^{-3}$ mbar to $5 \cdot 10^{-2}$ mbar,
Process power: 0.5 to 4 W/cm$^2$, in particular 1.0 to 3 W/cm$^2$,
Process gas: in particular argon, but also argon/oxygen, argon/nitrogen, argon/hydrogen or argon/hydrocarbons,
Gas flow: 5 to 140 sccm, in particular 10 to 50 sccm
Deposition rates: 0.05 to 10 mg·h/cm$^2$, in particular 0.2 to 0.5 mg·h/cm$^2$,
Layer thickness range: 50 nm to 100 µm.

If the process pressure is set too high, in general a nanoscale fiber structure is no longer obtained, but rather a thin planar layer. The behavior is the opposite at excessively low pressures. The plasma is no longer stable and can break down.

The process power acts on the deposition rate linearly, in other words the higher the process power the higher the deposition rate. Therefore, as high a power as possible is desirable. At excessively high powers, however, the target can be destroyed.

If argon is used, no reaction takes place during the deposition, and ideally the raw material is deposited unaltered. If reactive gases are used, a reaction occurs, altering the composition of the deposited material.

Without being bound to any particular theory, the gas flow plays a subordinate role. However, it should be set sufficiently high that the desired process pressure can be achieved in the sputtering chamber used.

A comparatively high deposition rate is achieved in the present case, and is possibly also of importance for the formation of the net-like nanostructure.

The layer thicknesses of the deposited layers were typically in the range of 50 nm to 100 µm. In this context, the deposition time varies between 10 minutes and 10 hours, in particular between 1 and 5 hours.

However, the following are important for the formation of the net-like porous nanostructuring in the deposited material:

Temperature range of the substrate: 400° C., preferably 500° C. to 1200° C.,
Carbon content of the target: 0.1 to 25% by weight, in particular 2 to 7% by weight.

Certain embodiments of the invention relate to a method for producing a nanostructured electrode for an electrochemical cell, in which active material is applied to an electrically conductive substrate, the active material being deposited on the electrically conductive substrate by magnetron sputtering in one process step, a ceramic target comprising a cathode material having an additional carbon proportion being used, and the substrate being kept at temperatures between 400° C. and 1200° C. during the deposition.

In the method, in particular LiFePO$_4$, Li$_4$Ti$_5$O$_{12}$, lithium metal oxides of the LiM$_x$O$_2$ type where M=Co, Ni, Mn, Al, LiMn$_2$O$_4$ spinel, optionally partially substituted, lithium metal phosphates of the LiMPO$_4$ type where M=Fe, Mn, Co, V, optionally partially substituted, V$_2$O$_5$, or conversion materials, such as FeF$_3$, are used.

In the method, the additional proportion of carbon in the target is preferably selected between 0.1 and 25% by weight, in particular between 2 and 7% by weight.

In the method, preferably argon, argon/oxygen, argon/nitrogen, argon/hydrogen or argon/hydrocarbons are used as a working gas.

In the method, preferably a power density of 0.5 to 2 W/cm$^2$, in particular a power density of 1.0 to 1.5 W/cm$^2$, is set in the process chamber.

In the method, preferably a gas flow of 5 to 50 sccm, in particular a gas flow of 10 to 25 sccm, is set in the process chamber.

In the method, preferably a deposition rate of 0.1 to 1 mg·h/cm$^2$ is set, in particular a deposition rate of 0.2 to 0.5 mg·h/cm$^2$.

In the method, the deposition takes place for between 10 minutes and 10 hours, in particular between 1 and 5 hours.

Certain embodiments of the invention additionally relate to a nanostructured electrode for an electrochemical cell, comprising a coating of an active material for an electrically conductive substrate, the nanostructured active material having a porous structure that does not have a preferential direction perpendicular to the substrate surface.

The nanostructured active material of the electrode preferably has a fibrous structure, the fibers having a diameter in the range of 10 to 500 nm, in particular in the range between 10 and 200 nm.

The nanostructured electrode comprising preferably LiFePO$_4$, Li$_4$Ti$_5$O$_{12}$, lithium metal oxides of the LiM$_x$O$_2$ type where M=Ni, Co, Mn, Al, LiMn$_2$O$_4$ spinel, optionally partially substituted, lithium metal phosphates of the LiMPO$_4$ type, where M=Fe, Mn, Co, V, optionally partially substituted, V$_2$O$_5$, or conversion materials such as FeF$_3$ as an active material.

In the nanostructured electrode, the active material preferably has a porosity between 20 and 90%.

The nanostructured electrode may advantageously be produced by the aforementioned methods.

The nanostructured electrode is produced by magnetron cathode sputtering (magnetron sputtering) without the use of a mask/template and without the use of a catalyst. No toxic raw materials or solvents are required in the production of the nanostructured electrodes.

In certain embodiments of the invention, the nanostructured electrode is defined as an electrode that has for example structures that are resolvable using an electron microscope and that have dimensions in the nanometer range, without a particular preferred direction.

The raw material for the production (target) is brought into the vapor phase and subsequently advantageously condensed in the desired nanostructured form under the required process conditions. When carbon is added in the target, however, it has been found that the carbon itself is not additionally deposited, but the deposition of the active material influences the structure.

The raw material may advantageously be deposited directly on a current collector, and as a result additional process steps for producing and applying an electrode slurry to the current collector are omitted and the nanostructured electrode additionally does not contain any binders.

In general, layers produced by magnetron sputtering are distinguished in that they are very dense.

Figure 2:
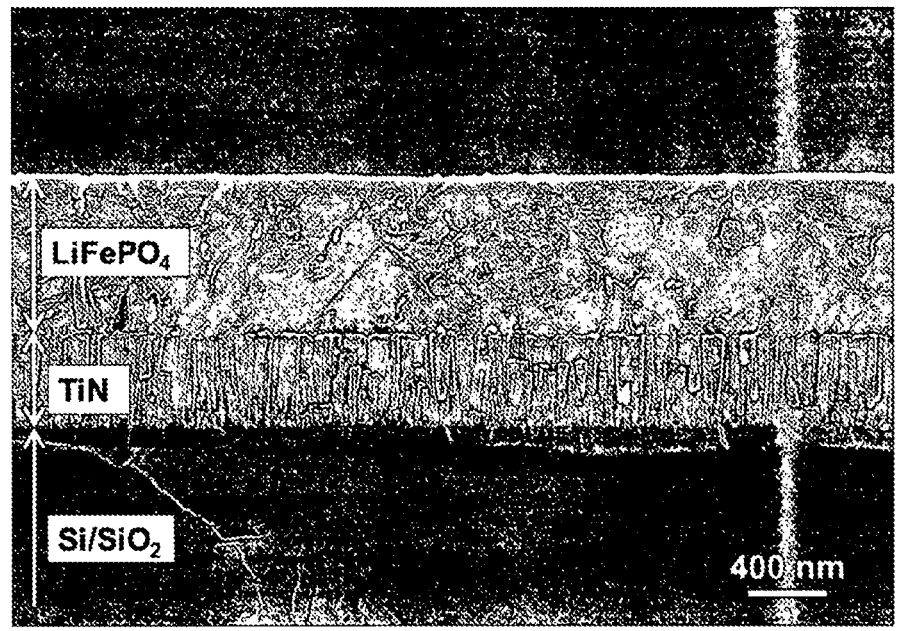
FIG. 2: shows dense TiN and $LiFePO_4$ layers on a silicon substrate.

For this purpose, FIG. 2 shows dense TiN and LiFePO$_4$ layers on a silicon substrate, such as are known for example from J. A. Thornton "Influence of substrate temperature and deposition rate on structure of thick sputtered Cu coatings", Journal of Vacuum Science & Technology, 1975, 12(4): pages 830-835, and which have been applied by magnetron sputtering.

If porous structures occur during the magentron sputtering, they generally only occur at low temperatures, in other words at room temperature or at temperatures of up to a few hundred degrees, since in this case there is a slight surface diffusion, as is known from Mahieu, S. et al., "Biaxial alignment in sputter deposited thin films", Thin Solid Films, 2006, 515(4): pages 1229-1249: When the temperature increases, the porosity of the layer generally decreases, since enhanced diffusion processes lead to a denser morphology.

According to certain embodiments of the invention, however, an opposite behavior is present. In magnetron-sputtered deposition of a LiFePO$_4$+C layer at room temperature, the layer is pore-free (see FIG. 3, left) (C here broadly describing carbon). Only for deposition at increased temperatures of for example 600° C. does the layer become porous (see FIG. 3, right).

The porosity P of a layer in % can be defined as followed:

$$P=(1-\rho_{layer}/\rho_{theo.density})*100$$

In the present case (see FIG. 3, right) this results in a porosity P of approximately 70%. Thus, in principle a layer is porous as soon as the density is less than the theoretical density.

Figure 4:
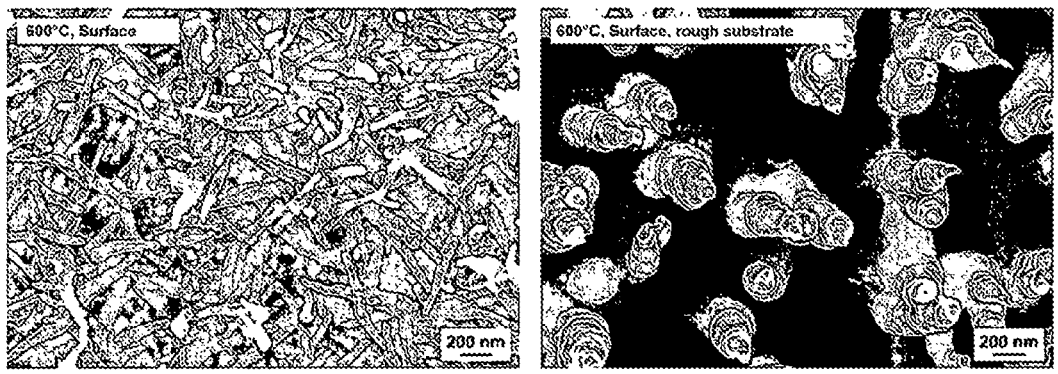
FIG. 4: shows fiber structures and networks on certain surfaces.

In this context, the porous layer according to certain embodiments of the invention, deposited on a smooth substrate, is formed by a very delicate, fibrous network. The individual fibers of this network have a diameter in the nanoscale range, in other words of 10 to 200 nm (see FIG. 4, left). The smooth substrate has been polished, resulting in a shiny (mirror-smooth) surface being achieved.

In the case of deposition on slightly rougher surfaces, in other words on unpolished substrates having a matt surface, a less cross-linked porous network forms. In this case, individual fibers form approximately vertically upwards. The fibers are somewhat thicker in this case, and have a diameter in the range of 10 to approximately 500 nm (see FIG. 4, right).

The production of the fiber structures and networks shown here is advantageously independent of the substrate material.

A comparable behavior, in other words a porous structure only occurring at higher temperatures, has thus far only been observed in the deposition of metals (nickel, gold, silver, aluminum, zinc). On this point, see also A. F. Jankowski and J. P. Hayes, Sputter deposition of a spongelike morphology in metal coatings, Journal of Vacuum Science & Technology A, 2003, 21(2): pages 422-425 and R. Gazia, et al. An easy method for the room-temperature growth of spongelike nanostructured Zn films as initial step for the fabrication of nanostructured ZnO, Thin Solid Films, 2012, 524(0): pages 107-112. In a particular pressure range and at a production temperature corresponding to approximately half the melting point of the metal, a porous structure can be observed. For non-metal materials, this phenomenon is not known thus far.

Alternatively, nanostructures can be manufactured by magnetron sputtering by glancing or oblique angle deposition (GLAD, OAD) (J. C. Sit et al., Thin film microstructure control using glancing angle deposition by sputtering, Journal of Materials Research, 1999, 14(4): pages 1197-1199). For this purpose, however, a specific construction, which results in lower deposition rates, is required. Further, this method has thus far only been applied for a limited number of materials (D. Manova, J. W. Gerlach and S. Mandl, Thin Film Deposition Using Energetic Ions, Materials, 2010, 3(8): pages 4109-4141.). Industrial applicability of the method does not appear reasonably possible.

Embodiment 1

According to certain embodiments of the invention, it is possible to produce nanostructured lithium iron phosphate (LiFePO$_4$) electrodes having additive carbon, which can be used as cathode materials in lithium ion batteries. As the starting material, a LiFePO$_4$ target, which additionally contains 7% by weight graphite carbon, is used. The target has a diameter of 250 mm, and the distance from the substrate is 55 mm. To produce the nanostructured electrodes, a process power of 600 W was applied. This corresponds to a power density of 1.2 W/cm$^2$. Argon was used as the process gas. The gas flow was 20 sccm and the process pressure was $5*10^{-3}$ mbar. The substrate temperature was set to 600° C. Under these conditions, a deposition rate of 0.3 mg/(cm$^2$*h) is achieved.

Figure 3:
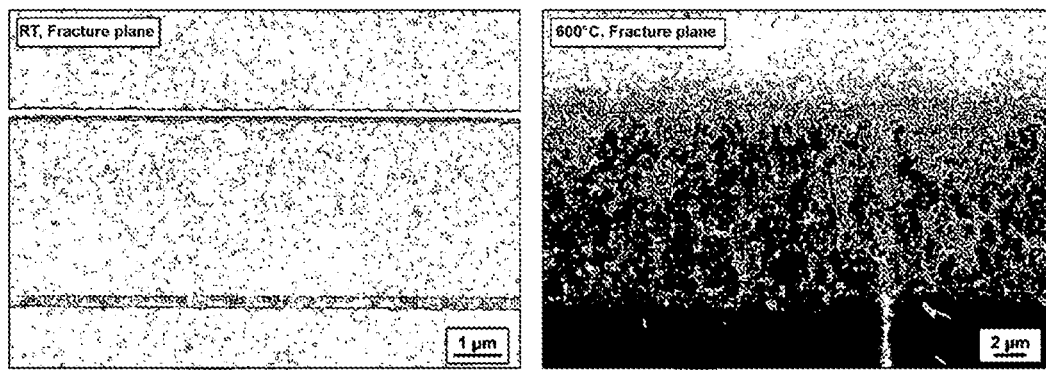
FIG. 3: shows magnetron-sputtered deposition of a $LiFePO_4$+C layer at certain temperatures.

The resulting nanostructure comprising LiFePO$_4$ without additional carbon after a deposition time of four hours is shown in FIG. 3, right and left. A titanium-nitride-coated, thermally oxidized silicon wafer was used as the substrate.

The nanostructured electrode material is produced by magnetron cathode atomization, and so as a basic requirement a process chamber is required by means of which this method can be carried out. In this method, a starting material is initially brought into the vapor phase by ion bombardment and subsequently condensed on a substrate. The ions are produced using a process gas that is ionized by an applied voltage. The substrate is located opposite the target containing the electrode material to be deposited. Oblique positioning of the substrate with respect to the target is not required.

Figure 5:
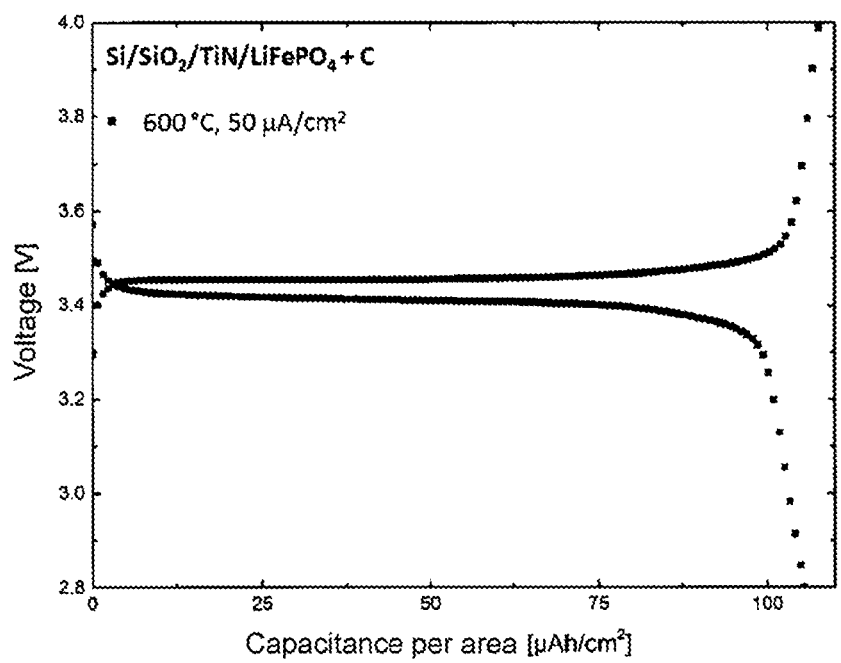
FIG. 5: shows the measurement curve of the electrochemical activity of nanostructured lithium iron phosphate ($LiFePO_4$) electrodes by comparison with a metal lithium anode.

FIG. 5 shows the measurement curve of the electrochemical activity of the nanostructured lithium iron phosphate (LiFePO$_4$) electrodes produced according to the invention according to embodiment 1 by comparison with a metal lithium anode. A liquid electrolyte, based on LiPF$_6$, dissolved in a 1:1 mixture of ethylene carbonate and dimethyl carbonate, was used as an electrolyte. The cell produced was charged and discharged using a current of 50 µA/cm$^2$ in the voltage range between 2.8 V and 4.0 V. The measurement curve demonstrates that the nanostructured LiFePO$_4$ electrode has the characteristic charging and discharging properties of LiFePO$_4$. This can be seen from the fact that a voltage plateau forms at approximately 3.4 V during charging and discharging. It is further found that during charging and discharging a comparable capacitance is achieved, corresponding to a high reversibility.

This example shows that it was possible to produce the net-like porous nanostructure in a non-metal material (LiFePO$_4$), which can advantageously be used as an electrode material for lithium ion batteries.

If this method can also be transferred to other non-metal materials, the scope of application could be extended considerably.

In principle all cathode materials (for example LiCoO$_2$, LiMn$_2$O$_4$, V$_2$O$_5$, LiMPO$_4$+C (where M=Ni, Co, Mn)) and anode materials (C, Li$_4$Ti$_5$O$_{12}$) are conceivable as further suitable materials for application as nanostructured layers. In particular, however, materials that undergo a major fluctuation in volume during the accumulation or decumulation of the lithium, such as silicon, are promising.

Alongside the aforementioned field of application of the electrode production, however, the method according to certain embodiments of the invention could also be beneficial in further fields of application, for example in the production of thermal insulation layers, fuel cells, capacitors, optical filters, sensors, magnetic stores or catalysts.

In summary, it can be said that for producing the nanostructuring according to certain embodiments of the invention it is important that the process parameters of process power, process gas, process pressure, gas flow and substrate temperature are set in a targeted manner. In this context, it is advantageous for the process pressure to be set to sufficiently low pressures (less than $5*10^{-2}$ mbar). It is essential for the substrate temperature to be set sufficiently high, in particular between 400 and 1200° C., and a ceramic target having a carbon proportion to be used.

In certain embodiments of the present invention, what is primarily important about the electrode produced is not the electrochemical properties, but rather the fact that the electrode has a porous, net-like nanostructuring, which can be produced by a simple magnetron sputtering method in just one process step. Thus far, nanostructures have often been produced by a solvent-based approach, such as solvothermal synthesis, electrodeposition or anodization. These methods generally required a plurality of steps, and in some cases toxic solvents/raw materials are used. Further, in this method, a drying step and in some cases also a crystallization step are required. Further, in some cases masks are used to obtain the desired structures. The application and removal of the masks further increases the expenditure of time.

Magnetron sputtering has the major advantage that the finished electrode layer can be produced in one step. No pre-treatments (such as applying catalysts, masks) and post-treatment (such as removing the masks, crystallization step, drying) are required. Further, the electrode can be deposited directly on a current collector, meaning that no binders or further conductive additives are required. No toxic raw materials are required, and the magnetron sputtering can even be applied to large substrates.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for producing a nanostructured electrode for an electrochemical cell, the method comprising:
providing an electrically conductive substrate and a target, wherein the target comprises a ceramic electrode material and carbon, the carbon proportion of the target being between 0.1 and 25% by weight;
heating the electrically conductive substrate to a temperature of between 400° C. and 1200° C.; and
depositing, via a single magnetron sputtering process step, the ceramic electrode material onto the electrically conductive substrate so as to form a fibrous porous network of fibers having a diameter in a range of 10-200 nm,
wherein the temperature of the substrate remains between 400° C. and 1200° C. during the depositing,
wherein the magnetron sputtering process step is performed with a power density of 0.5 to 2 W/cm$^2$, and
wherein the magnetron sputtering process step provides a deposition rate of 0.1 to 1 mg·h/cm$^2$.

2. The method according to claim 1, wherein the ceramic electrode material comprises one or more of LiFePO$_4$, Li$_4$Ti$_5$O$_{12}$, lithium metal oxides of the LiM$_x$O$_2$ type, where M=Co, Ni, Mn, Al, LiMn$_2$O$_4$ spinel, lithium metal phosphates of the LiMPO$_4$ type, comprising Fe, Mn, Co, V, V$_2$O$_5$, or conversion materials.

3. The method according to claim 1, wherein the carbon proportion of the target is between 2 and 7% by weight.

4. The method according to claim 1, wherein argon, argon/oxygen, argon/nitrogen, argon/hydrogen or argon/hydrocarbons are used as a working gas in the magnetron sputtering process step.

5. The method according to claim 1, wherein the magnetron sputtering process step is performed with a gas flow of 5 to 50 sccm.

6. The method according to claim 1, wherein a duration of the magnetron sputtering process step is between 10 minutes and 10 hours.

7. The method according to claim 1, wherein the power density is 1.0 to 1.5 W/cm$^2$.

8. The method according to claim 5, wherein the gas flow is 10 to 25 sccm.

9. The method according to claim 1, wherein the deposition rate is 0.2 to 0.5 mg·h/cm$^2$.

10. The method according to claim 6, wherein the duration of the magnetron sputtering process step is between 1 and 5 hours.

11. The method according to claim 1, wherein the ceramic electrode material is LiCoO$_2$.

12. The method according to claim 1, wherein the electrically conductive substrate is thermally oxidized.

13. The method according to claim 12, wherein the electrically conductive substrate is a coated, thermally oxidized silicon wafer.

14. The method according to claim 13, wherein the thermally oxidized silicon wafer is coated with titanium-nitride.

* * * * *